United States Patent [19]

Walker et al.

[11] Patent Number: 4,661,709
[45] Date of Patent: Apr. 28, 1987

[54] MODULAR ALL-ELECTROSTATIC ELECTRON-OPTICAL COLUMN AND ASSEMBLY OF SAID COLUMNS INTO AN ARRAY AND METHOD OF MANUFACTURE

[75] Inventors: David M. Walker, Westford; Alan P. Sliski, Lincoln; Kenneth J. Harte, Carlisle; John J. Carrona, Concord, all of Mass.

[73] Assignee: Control Data Corporation, Minneapolis, Minn.

[21] Appl. No.: 749,792

[22] Filed: Jun. 28, 1985

[51] Int. Cl.⁴ .............................................. H01J 3/38
[52] U.S. Cl. ................................ 250/396 R; 250/398; 250/492.2; 313/250; 313/257; 313/292; 313/325
[58] Field of Search ................ 250/396 R, 398, 492.2; 313/250, 257, 292, 325

[56] References Cited

U.S. PATENT DOCUMENTS 3,383,537 5/1968 Marshall .............................. 313/250
3,462,629 8/1969 Bell ..................................... 313/292

Primary Examiner—Bruce C. Anderson
Assistant Examiner—Jack I. Berman
Attorney, Agent, or Firm—Charles W. Helzer

[57] ABSTRACT

The invention provides a modular-building block method and system of fabrication, installation, alignment and operation of a multi-beam assembly of miniaturized, all-electrostatic charged particle optical columns, such electron beam or ion beam optical columns mounted in parallel in a closely packed cluster over a small target surface area for parallel simultaneous charged particle beam writing on the target surface with the multiple-channel cluster of charged particle beam optical columns. The assembly provides a system and method of increased thru-put in the direct charged particle beam writing on semiconductor target wafers during fabrication of semiconductor micro-circuit chips.

22 Claims, 12 Drawing Figures

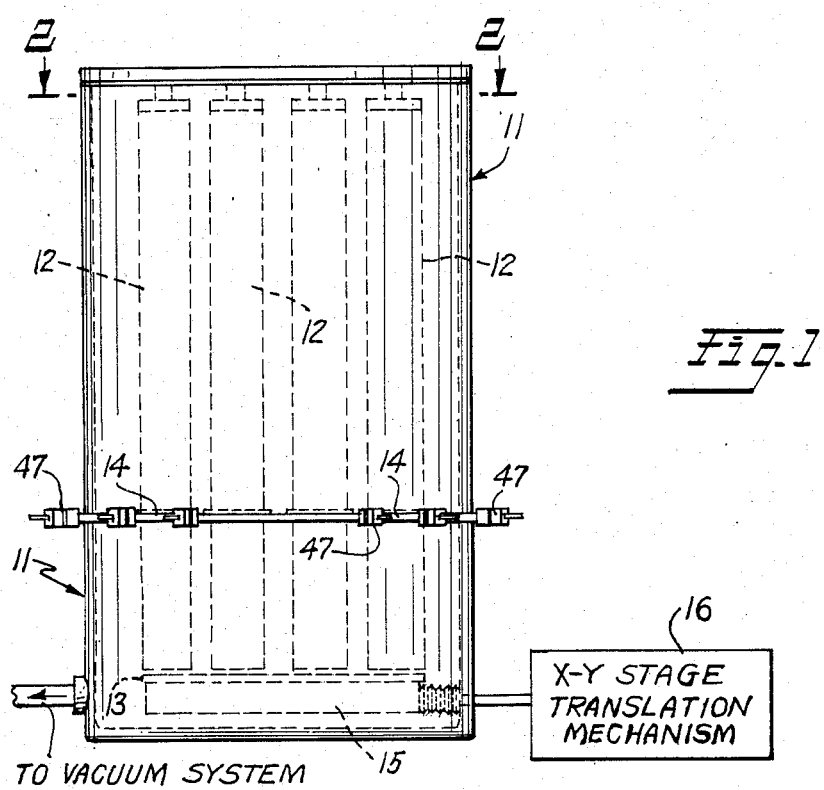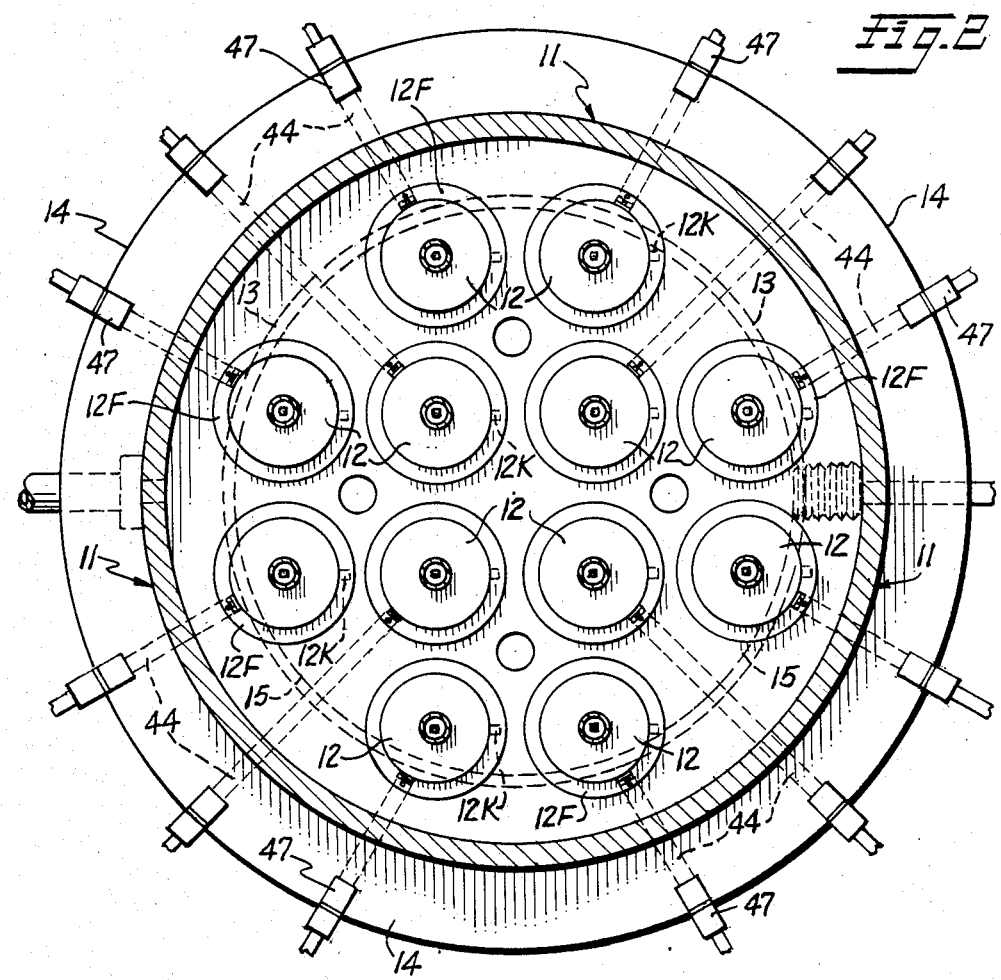

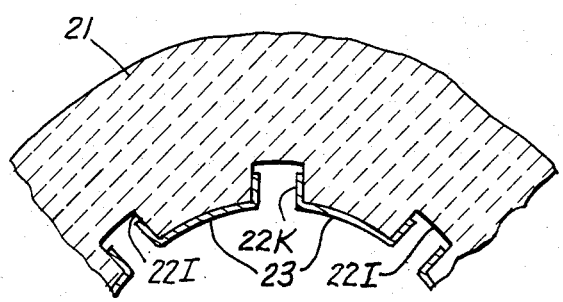
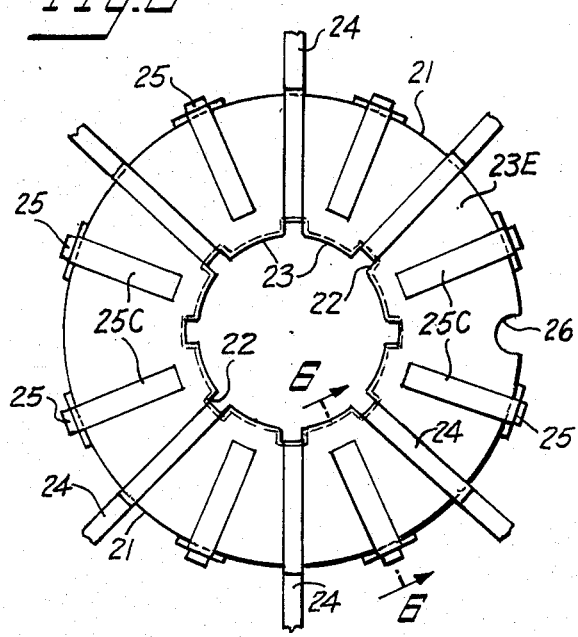
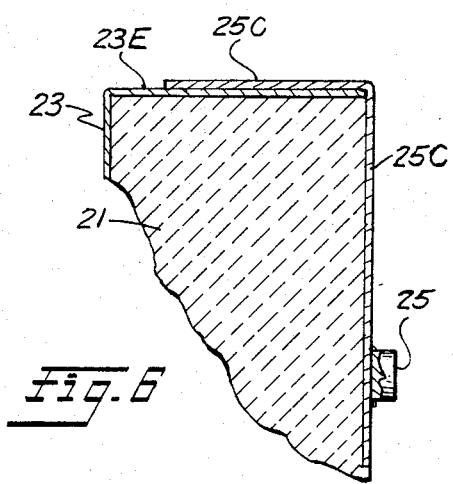
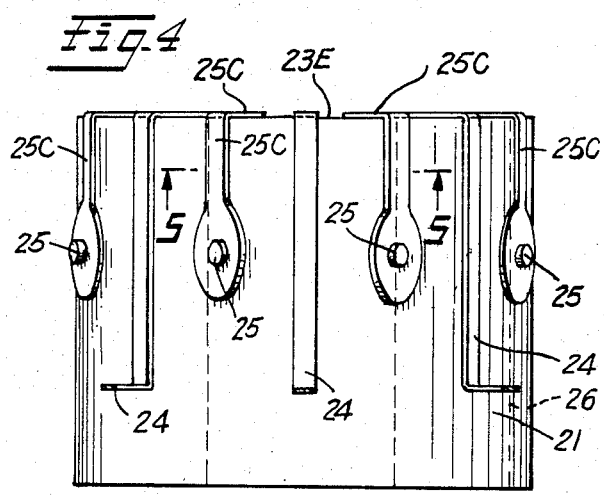
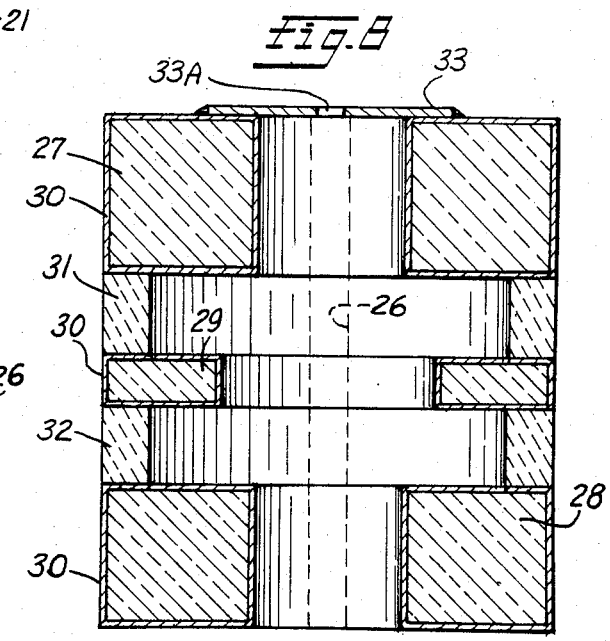
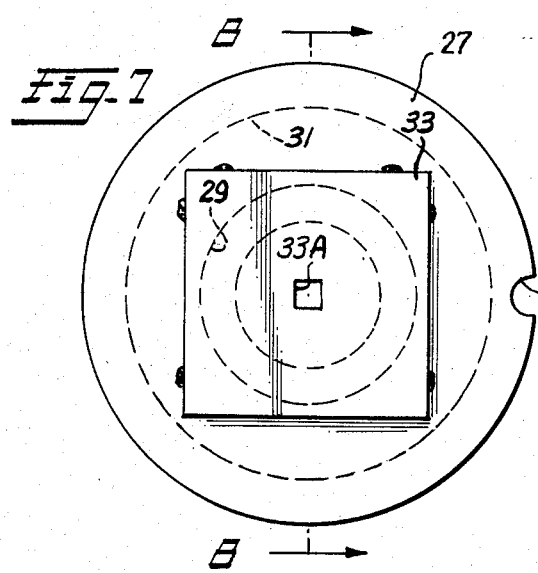

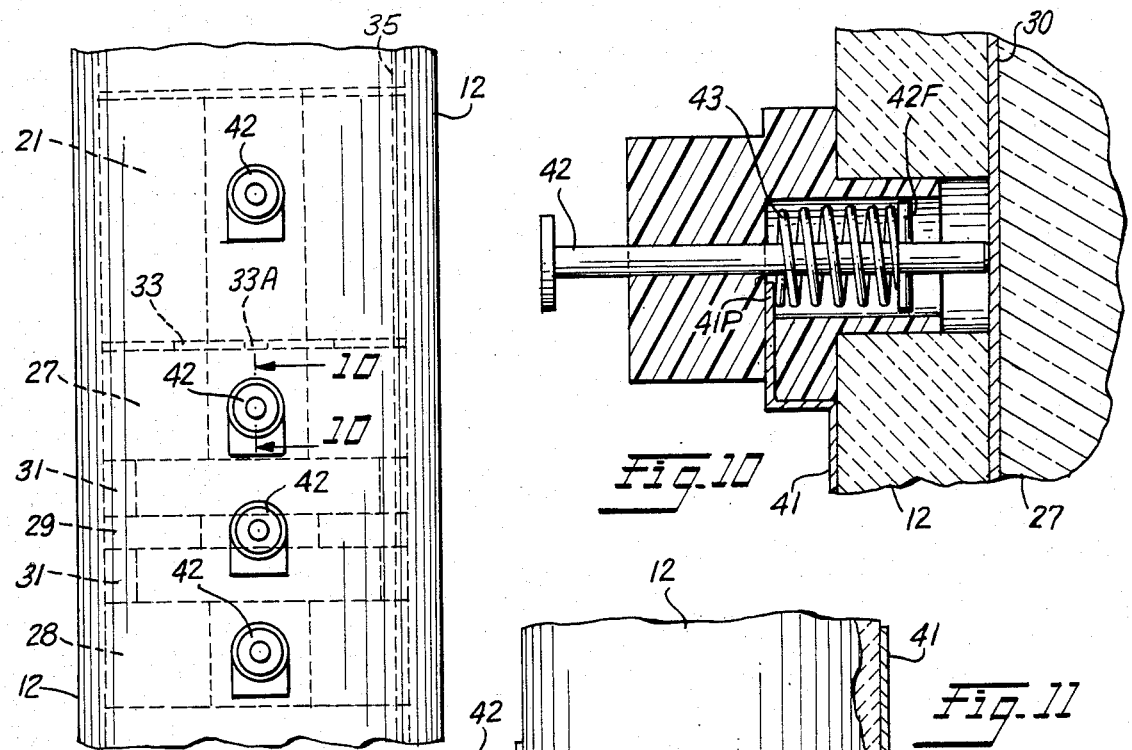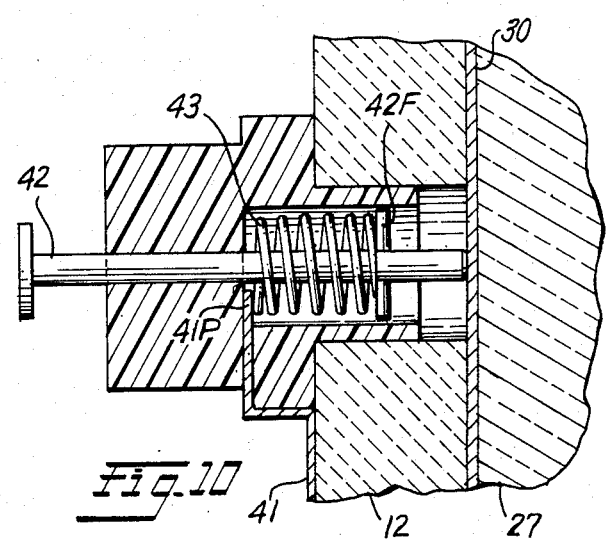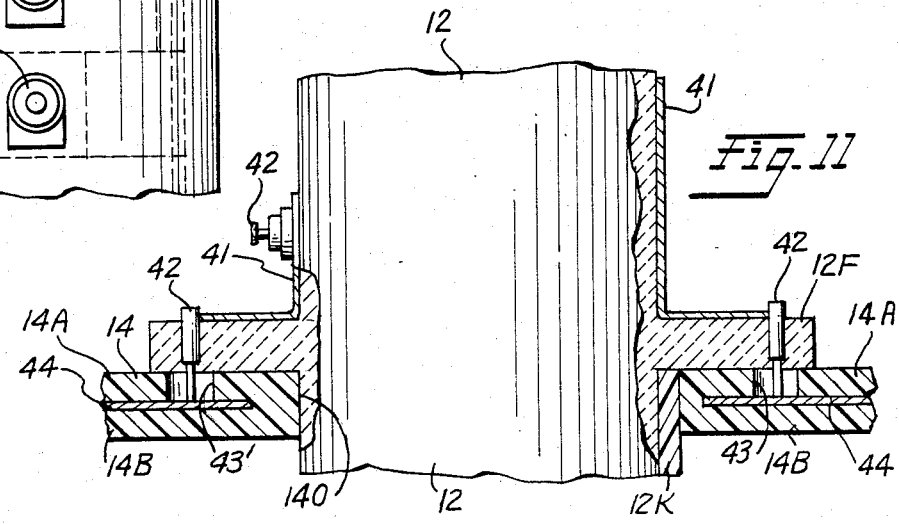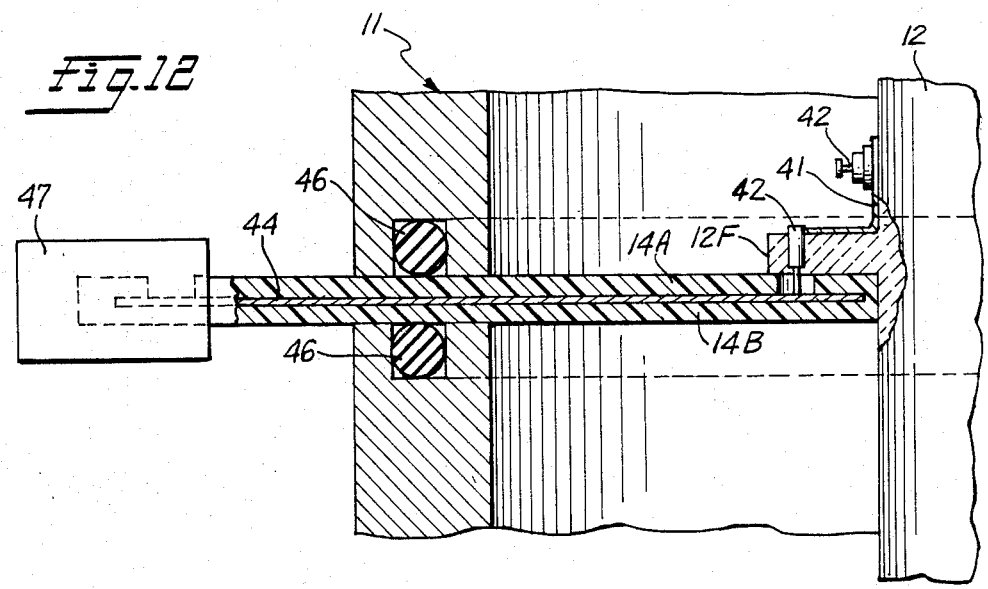

MODULAR ALL-ELECTROSTATIC ELECTRON-OPTICAL COLUMN AND ASSEMBLY OF SAID COLUMNS INTO AN ARRAY AND METHOD OF MANUFACTURE

FIELD OF INVENTION

This invention relates to a novel modular electron-optical column and method of construction employing standardized modular components which are simple, readily assembled and low cost.

The invention also relates to a multi-channel assembly of such electron-optical columns operated together in a compact array over a column small target area within a common evacuated outer housing. The multi-channel assembly employs a novel support member for simply and effectively mounting the multiple electron-optical columns within an evacuated housing in proper alignment both axially and rotationally, and for supplying the columns with required operating and control electric potentials.

The invention further relates to a novel support member having printed circuit wiring patterns formed thereon for the supply of electric operating and control potentials to the respective electron-optical columns of a multi-channel assembly through the vacuum-tight walls of an outer evacuated housing. The support member is constructed so that it forms and uses a laminated, hermetically-sealed ceramic package having internally formed printed wiring feed-thru conductors that do not interfere with the maintenance of a vacuum-tight seal around the support member.

BACKGROUND PRIOR ART PROBLEM

An improved apparatus and method for increasing thru-put of electron beam lithography systems employing direct electron beam writing is disclosed in co-pending U.S. application Ser. No. 749,796 filed June 28, 1985 entitled "Multiple Channel Electron Beam Optical Column Lithography System and Method of Operation'-'—Kenneth J. Harte, inventor and assigned to Control Data Corporation. In this new system it is possible to directly write with more than one electron beam in parallel on a single substrate semiconductor wafer. To accomplish this, the diameter of the individual electron-optical columns which are clustered over a single target semicoductor wafer must be significantly smaller than that of the wafer itself in order to accommodate a sufficient number of electron-optical columns in the cluster to provide the desired increase thru-put. Theoretically, electron optical columns designed with all electrostatic optics can meet this requirement. However, each electron optical column must employ component structures which keep the components in alignment both axially and rotationally, and the cluster of electron-optical columns forming the multi-channel assembly must be mechanically referenced to each other and provided with many electrical connections that have to be brought through a vacuum-tight wall without impairment of the vacuum within the housing in which the assembly of electron beam optical columns is mounted.

In a typical multi-beam system employing a multiplicity of single beam electron-optical channels, the channels must be mounted on 40 milimeter centers in a square or rectalinear array. Mechanical support, alignment and wiring must be provided for each of the individual electron-optical columns comprising the respective channels within the 40 millimeter center to center spacing. This involves approximately 400 electrical connections between the channels and the external control and supply electronic circuits so that the use of known discrete wiring techniques to supply the individual channels is impossible. In order to overcome these problems the present invention was devised.

SUMMARY OF INVENTION

This invention provides a novel modular-building block method and system of fabrication, installation, alignment and operation of the miniaturized, all-electrostatic electron-optical columns mounted in a closely packed cluster over a small target surface area for simultaneous, parallel electron beam writing or electron beam inspection of a plurality of discrete microminiature areas on a common target surface. This makes possible increased thru-put in the direct electron beam writing or inspection of semiconductor target wafers during fabrication of electronic microcircuit patterns.

A first modular concept according to the invention is in the construction of the electron beam optical column components such as the lens, deflector and aperture elements to form a readily assembled, easy to align and low cost miniaturized, all-electrostatic electron beam optical column.

A second modular concept is used in the provision of a mechanical support structural member which allows precise alignment and ready connection of supply and control electrical potentials to each of the components which comprise an individual electron-optical column or channel. This concept employs an insulating, elongated housing cylinder whose inside diameter forms an interference press fit to the outside diameter of the modular components (lens, deflectors, apertures) comprising the electron-optical column. The design further includes an appropriate cooperating key and keyway system to provide axial and rotational alignment for the components of the optical column together with the use of simple electrically insulating spacers to provide for proper axial spacing of the components as well as electrical isolation between the components. Electrical connections to the individual components of the electron-optical column within each housing cylinder is provided by appropriately designed printed wiring circuit patterns formed on the outside surface of the insulating housing cylinders. Suitable, snap-action plunger type electrical contacts are mounted on the exterior of the cylindrical housing to provide thru-electrical connections from the respective printed wire conductors to the individual components within the electron-optical column.

A further modular approach is provided in the assembly of a plurality of the electron-optical columns constructed in the above briefly described manner into a multi-beam assembly of close, compact construction. This is achieved by mounting the plurality of electron-optical columns in a cluster on an insulating support member which serves to mechanically position and hold the cluster columns both axially and rotationaly within the assembly. The insulating support board has a plurality of openings formed therein which provide an interference press slide fit for the lower external diameters of the respective modular electron-optical columns up to an axially intermediately positioned flange which, after insertion of a column in its opening, is secured to the support board. The openings and lower cylindrical surface of the electron-optical channels are provided with coacting key and keyway alignment parts which serve to rotationaly align the individual electron-optical column on the support member relative to each other and to a column target surface for the assembly.

Supply printed wiring conductor patterns are formed on the insulating support member in position to align with the printed wiring conductor patterns formed on the exterior surface of the respective outer housings of the electron-optical columns, and suitable snap-acting electrical connector means are provided to facilitate snap-action connection of the supply printed wiring conductor patterns on the insulating support member to respective, associated printing wiring conductors on the housings of the electron-optical columns.

The insulating support members designed as described above preferably are comprised by two or more layers of ceramic with the supply conductive wiring patterns being formed on internal surfaces of the layers which then are pressed together and fired to form an hermetically sealed, smooth surface structure. The insulating support member thus formed is used as one half of an O-ring vacuum seal in a two part separable, evacuated outer housing for the entire cluster of the multi electron-optical column assembly. Thus, the insulating support member serves not only to physically support and align the multi-channel electron beam optical column assembly but also serves as a vacuum feed-thru for the supply electrical conductors for the electron beam optical columns comprising the assembly.

In practicing the invention, a novel, compact, easily assembled and aligned, low cost, single deflector stage, all-electrostatic electron beam optical column is provided which is fabricated from standardized, low cost, modular elements readily assembled and aligned at low cost. The modular elements comprise an outer hollow, elongated, insulating housing and a plurality of modular, unitary structure lens, deflector and aperture elements together with interspersed insulating spacer elements each of unitary annular block construction. The outside dimensions of the modular, unitary structure lens, deflector and aperture elements are designed to provide an interference, slide press fit within the inside diameter of the hollow, elongated insulated housing. Printed wiring conductor pathways are formed on the outer surface of the elongated insulating housing with discrete spring-biased, snap-action, thru-electrical connection contactors mounted on the housing at different points along the axial length of the housing. The contactors provide ready electrical connection to exposed conductive contact surfaces on the respective modular lens, deflector and aperture elements which are physically supported within the housing in a predesigned axial position by the interspersed, insulating spacer elements whereby preformed printed wiring conductors for the supply of operating and control electric potentials readily can be connected to the elements of the respective electron-optical columns. Suitably designed, interacting key and keyway means are formed on the elongated housing and the respective modular elements to provide desired rotational orientation of the respective elements upon being inserted into the housing.

A further feature of the invention is the provision of a multi-channel assembly of single deflector stage, miniaturized, all-electrostatic electron beam optical columns fabricated in the above briefly described manner which are mounted in a compact array or cluster on a common insulating support member. The support member has preformed openings therethrough substantially of equal dimensions to the outside dimensions of the elongated insulating housings for the respective electron beam optical columns. These openings securely hold the columns in a preset array aligned both rotationaly and positioned axially with their electron beam optical axes orthogonal to the support member and parallel with respect to each other. The predesigned opening for each electron-optical column and the elongated housings include coacting alignment key and keyways to assure proper rotational alignment of each column. Sets of printed wiring conductors are formed on the common insulating support member adjacent to each opening for supplying operating voltages and control signals to the elements of the respective electron-optical column supported within the opening. Suitable snap-acting electrical connector means are provided for selectively connecting the discrete printed wiring conductor patterns formed on the outer surface of respective elongated insulating housing of each electron-optical column to respective complementary supply printed wiring conductors formed on the common insulating support member.

A further feature of the invention is the manner in which the common insulating support member is fabricated from two or more ceramic layers having the supply printed wiring conductor patterns formed on mating inside surfaces and co-fired to form an integral, hermetically sealed package. The package is provided with through-layer conductor vias formed on the ceramic layers before firing to allow for connections of respective printed wiring conductors on the interior mating surfaces of the board-like support member to printed conductors on either outside surface of the board-like support member and vice versa.

A still further feature of the invention is the provision of a multi-channel assembly of single beam electron-optical columns constructed in the above described manner wherein the compact cluster of electron beam optical columns is mounted within a common outer evacuated housing for common evacuation of the separate electron beam optical columns in the cluster. The cluster is supported by the common insulating support member in direct electron beam writing position over a common semiconductor target wafer movably supported on a movable-target stage within the evacuated common outer housing. The outer edges of the common insulating support members are extended to project outside of the common outer evacuated housing around its entire periphery so as to separate the outer housing into two portions with the common insulating support member being clamped between the two separated outer housing portions by suitable O-ring seals. In the event that a single source of evacuation is provided for the outer evacuated housing, appropriate additional openings are provided through the insulating support member within the evacuated housing so as to provide for out-gassing of the entire outer housing structure through the medium of the single source of evacuation.

BRIEF DESCRIPTION OF DRAWINGS

These and other objects, features and many of the attendant advantages of this invention will be appreciated more readily as the same becomes better understood from a reading of the following detailed description when considered in connection with the accompanying drawings, wherein like parts in each of the several figures are identified by the same reference character, and wherein:

FIG. 1 is a side plan view of a novel, miniaturized, modular, all-electrostatic electron beam lithography system constructed in accordance with the novel method of modular fabrication and assembly pursuant to the present invention;

FIG. 2 is a top plan view of the miniaturized, modular, all-electrostatic electron beam lithography system shown in FIG. 1;

FIG. 3 is a top plan view of a novel, miniaturized, modular electrostatic deflector element fabricated according to the invention;

FIG. 4 is a side plan view of the modular deflector element shown in FIG. 3;

FIG. 5 is a partial cross-sectional view of the modular deflector element shown in FIGS. 3 and 4 and taken through plane 5—5 of FIG. 4;

FIG. 6 is a partial, longitudinal sectional view of the modular electrostatic deflector element shown in FIGS. 3 and 4 and taken through plane 6—6 of FIG. 3;

FIG. 7 is a top plan view of the construction of a novel, modular, electrostatic aperture element mounted on the end lens element of a three plate element Einzel lens section constructed according to the invention;

FIG. 8 is a longitudinal sectional view of the three plate element, modular Einzel lens section together with aperture constructed according to the invention and taken through plane 8—8 of FIG. 7;

FIG. 9 is a side view of a partial longitudinal section of a novel modular electron-optical column fabricated according to the invention and shows a portion of the optical column in which a modular, three plate element Einzel lens section with aperture followed by a modular deflector element, all fabricated according to the invention, are mounted within an outer eleongated insulating housing and provided with electrical operating potential supply printed conductors together with snap-action thur-connectors;

FIG. 10 is a cross sectional view of a snap-acting thru-electrical connector mounted on the elongated insulating housing within which the modular lens, deflector and aperture elements are mounted and taken through plane 10—10 of FIG. 9;

FIG. 11 is a partially broken-away, fragmentary view of still a different portion of the elongated insulating housing within which the modular elements of electron beam optical columns are mounted, and shows the manner in which printed wiring conductor patterns formed on the outside surfaces of the elongated housing are connected to supply printed wiring patterns formed on a common support board member which also mechanically supports and axially and rotationally aligns the outer housings of the respective electron bean optical columns automatically upon insertion of the column within the support member board; and FIG. 12 is a partial, longitudinal sectional view of an outer evacuated housing beyond which the outer circumferential edge of the insulating support member having electrical supply printed wiring patterns formed thereon projects, and illustrates the novel construction of the insulating support member board and its use as both an electron-optical column support mounting member and electrical supply wiring pattern vacuum feed-thru member for supplying electrical potentials through the outer evacuated housing to the multiple assembly of electron-optical columns within the housing.

BEST MODE OF PRACTICING THE INVENTION

Overall Assembly

FIGS. 1 and 2 of the drawings show the overall assembly of a novel, modular, all-electrostatic electron beam lithography system for providing direct electron beam writing from a multi-channel compact cluster of individual electron beam optical columns simultaneously on a relatively small target semiconductor wafer according to the invention. In FIG. 1, an outer, evacuated housing is shown at 11 within which a multi-channel assembly of individual electron beam optical columns 12 are mounted in a compact cluster. The multiple electron-optical columns 12 are substantially identical in construction and operation as will be described hereafter. The columns 12 are supported over respective, relatively small target surface areas on a target semiconductor wafer 13 upon which a multiplicity of semiconductor microcircuit chip patterns are to be written simultaneously pursuant to the teachings in co-pending U.S. patent application Ser. No. 749,796 filed concurrently herewith and entitled "Multiple Channel Electron Beam Optical Column Lithography System and Method of Operation"—Kenneth J. Harte, inventor and assigned to Control Data Corporation, the disclosure of which is hereby incorporated into the disclosure of this application in its entirety. The electron beam optical columns 12 are physically supported in precisely aligned axial and rotational orientation by means of an insulating support board member 14, to be described hereafter, and the semiconductor target wafer surface 13 is supported on a movable stage member 15 under the control of a controllable x-y stage translation mechanism 16 as described more fully in the above referenced co-pending application Ser. No. 749,796.

Deflector Elements

As noted above, the standardized modular electron beam optical columns 12 all are of substantially identical construction and employ a number of modular component electrostatic deflector, electrostatic lens and electrostatic aperture elements whose construction has been standardized in the interest of simplicity and low cost and ease of assembly and alignment during manufacture. FIG. 3 is a top plan view of a novel, modular, electrostatic deflector element 21 fabricated in accordance with the present invention and FIG. 4 illustrates the deflector element in a side plan view. The main design considerations for reliable electrostatic deflector elements are uniform and reproduceable blade (deflector electrode) area and spacing, and lack of exposed insulating material that could be "charged" by stray electrons associated with the electron beam.

The deflector design shown in FIGS. 3 and 4 utilizes annular-shaped cylinders of insulating materials such as ceramic or glass having precise concentric inside and outside diameters and which are used to form the unitary structure block-like deflector elements 21. As best seen in FIG. 3, axially extending, small slots or kerfs 22 are cut into the inside surface of the central opening of the annular-shaped cylinder extending from the inside diameter towards the outside diameter with the number of kerfs being equal to the desired number of deflector blade areas 23 as shown in FIG. 4. The depth of each cut or kerf 22 should be approximately 3 to 4 times that of the kerf width, so that after metallization of the inside (deflector electrode) blade surface, the field from an exposed insulating ceramic at the bottom of the kerf is well shielded. The design utilizes precision ground ceramics or other machineable insulating materials in cylindrical sections of desired length and annular cross section with appropriate inside and outside diameters. The deflector can have 2, 4 or 8 blades (deflector electrode areas 23, 8 being shown in FIG. 3) with 0.1 to 0.2 millimeter gaps between the blades provided by the non-metallized exposed insulating ceramic or glass at the bottom of the kerfs. The blades should have 3 to 5 millimeter spacing between opposite pairs of blades and lengths varying from 10 to 40 millimeters for use in electro-optical columns of practical design.

After forming the kerfs 22, the bottoms of the kerfs are covered by masking wires 24 and the inside diameter blade surfaces and annular-shaped side surface segments 23E contiguous to the respective blade surfaces 23 and the ends of the ceramic block are metallized with a non-oxidizing metal, preferably gold, to form the conductive blade areas as shown at 23 in FIG. 3. When stripped away, the masking wires 24 leave the bottom of the kerfs with an insulating surface as shown in 22I in FIG. 5. To this end, the bottoms of the kerfs 22 are masked to provide electrical isolation from one blade area 23 to the next. One method of masking is to install relatively thin flat wires illustrated at 24 which mask the bottoms of the slots (kerfs 22) and an alignment strip radially extending outward across the annular cross-sectional segment end area of the block from each kerf as shown in FIG. 3. To be safe, the masking wire 24 should be run for a certain distance along the outside diameter surfaces as shown in FIG. 4 to assure against short circuiting of the individual blades or deflector electrode areas 23 in this region during metallization. By masking in this manner, some metallization will occur on the side edges of the kerfs 22 as shown at 22K in FIG. 5 to thereby reduce exposed insulating areas within the kerfs to a minimum where otherwise stray electrons might cause charge build-up. In preferred embodiments of the novel deflector element, thick film electrically conductive contact pads shown at 25 are formed on the outside surfaces of the ceramic block 21 in alignment with the respective blade areas 23, as shown in FIGS. 3, 4 and 5, and has an integral thick film conductor strip 25C further deposited over the already metallized annular-shaped end segment surfaces 23F to provide good electrical connection to the deflector electrode or blade areas 23 as shown in FIGS. 4 and 6.

In order to assure proper rotational orientation to each deflector element 21 when it is assembled together with other elements in the outer elongated housing 12, a suitable axially extending keyway guide shown at 26 in FIG. 3 is provided in the outer cylindrical surface of the annular-shaped block element. This keyway guide extends axially in parallel with the central axis of the center opening through the annular-shaped block and coacts with a complementary key formed on the interior surface of outer housing 12 to provide predesigned rotational orientation to the deflector lens elements upon its assembly with other elements in the elongated housing 12.

Lens Element

The electrostatic lens elements shown at 27 and 28 in FIG. 8 consist of sets of electrically conductive concentric rings of interior diameter opening and spacing defined by the design of the electron-optical column with which the lens elements will be used. The main design considerations are axial alignment of at least each lens element with respect to its neighboring lens element and uniformity of the radius of the internal opening. The lens elements utilize annular-shaped cylinders of ceramic or other insulating material that are of appropriate outside and inside diameter and whose surfaces both on the inside opening and on the outside cylindrical surface as shown at 30 and on the interconnecting annularly-shaped end surface segments, are uniformly metallized. If desired, additional contact pad areas such as shown at 25 in FIG. 4 may be added to the outside diameter surfaces of the lens elements, but inclusion of such specially formed contact pad areas is not required since the lens elements are metallized uniformly all over.

FIG. 8 shows the construction of a three-plate element, Einzel lens section wherein upper and lower lens elements 27 and 28 are mounted on opposite sides of a center lens element 29 of different optical design from the two outer lens elements 27 and 28 and electrically isolated from the two outer lens elememts by two annular-shaped insulating spacer elements 31 and 32. As will be explained later in the description, different electric potentials can be applied to the three lens elements 27, 29 and 28 to achieve a desired electron beam focusing effect in a known manner. For this type three-plate lens section construction, the center lens element 29 is of different configuration from the two outer lens elements 27 and 28 due to its larger internal diameter opening and its thinner, flatter axial extent as shown in FIG. 8. The insulating spacer elements 31 and 32 have considerably larger internal diameter openings than the lens elements 27, 29, 28 in order to protect their internal, axially extending insulating side surfaces from accumulating a charge build-up from stray electrons from the electron beam which normally in its undeflected state passes through the center axis of the structure shown in FIG. 8. The three lens elements 27, 28 and 29 typically vary from 3 to 6 millimeters inside diameter and from 0.2 to 12 millimeters in length depending upon the optical design of the column in which they are mounted.

Aperture Element

FIGS. 7 and 8 of the drawings also illustrate the construction of a suitable aperture element for use with the three-plate element lens section shown in FIGS. 7 and 8. The aperture element is formed by securing an apertured plate 33 to the end of the last lens element, such as 27, in the three-plate element lens section. The apertured plate 33 has a centrally formed aperture 33A of suitable configuration, such as the square shown in FIG. 7, which may be etched through 100 single crystal silicon wafer plates using an anisotropic etching process. Depending upon the design use for the apertured plate, square holes, round holes, triangular-shaped holes and other configurations can be fabricated using SiO2 etchant masking or boron diffusing masking. After etching the individual apertures, the plates 33 are cut from the silicon wafer and optically aligned with the center optical axis of the lens structure as shown in FIG. 8 using a microscope. When aligned, the apertured plate 33 is attached using a low temperature solder or other electrically conductive securement technique which allows the apertured plate 33 to be maintained at the same electrical potential as the lens element 27 to which it is secured. It is believed obvious to those skilled in the art that aperture elements of any desired thickness or material could be formed by mounting a plate such as 33 to a thinner and flatter lens element such as the center lens element 29 dependent upon the intended design use for the aperture.

While many apertures used in an electron-optical column are operated at the same potential as the last lens plate element of a lens section as shown in FIGS. 7 and 8, there is need for aperture elements which can be operated at potentials different from the lens elements. For example, blanking apertures are operated normally at ground potential. For such use, an aperture element could be fabricated as shown by securing an apertured plate 33 to a lens element 27. The aperture element thus constructed could then be mounted within the electron beam optical column by the use of insulating spacers, such as 31 and 32, on its opposite end surfaces to electrically isolate the aperture element from other elements in the electron-optical column.

Modular Electron Beam-Optical Column Assemblies

To assemble a complete, modular electron optical column according to the invention, the individual components described with relation to FIGS. 3-8 of the drawings must be assembled together with an electron gun (not shown) and a backscatter detector (not shown) and held in precise axial and rotational alignment. In addition, electrical connections must be provided for the respective elements. For this purpose, the invention employs outer elongated insulating housing 12 shown generally in FIGS. 1 and 2 of the drawings, and detailed fragmentary portions of the housing is shown in FIGS. 9-12 of the drawings. The elongated, insulating housing 12 is designed to provide an inner cylindrical opening having an inside diameter which matches the outside diameters of the individual, modular, annular-shaped lens, deflector and aperture elements and spacers fabricated as described above with relation to FIGS. 3-8. The inside diameter-outside diameter match together with the use of the interspersed spacer elements 31 and 32 of known axial thickness provides proper axial alignment of the modular elements within insulating housing 12. Rotational alignment is accomplished using a matching keyway 26 formed in the outside cylindrical surfaces of the respective deflector, lens and aperture elements and an axially extending, co-acting, rib-like key formed on the internal surface of the cylindrical elongated insulating housing 12 as shown at 35 in FIG. 9. The design is such as to provide a slide interference press fit between the outside diameters of the components and the inside diameter of elongated insulating housing 12 as the components are inserted into housing 12 one at a time in the order required by the electron-optical column design together with interspersed insulating spacers 31 and 32 and the like. The interference fit of the components can be accomplished in a number of ways including differential heating of the outer insulating housing 12 or cooling of the inner lens, deflector and aperture elements, or by choice of materials having sufficiently different thermal expansion coefficients and using uniform heating. A suitable electron gun for use in the assembly is disclosed in co-pending U.S. Application Ser. No. 749,787 filed June 28, 1985, entitled "Sapphire Grid Flat Cathode Gun", filed concurrently with this application, John Valun and Kenneth J. Harte—inventors, and assigned to control Data Corporation. Any suitable known commercially available backscatter electron detector can be employed to complete the respective electron beam channels.

The supply of required electrical operating and control potentials to the lens, deflector and aperture elements of the electron-optical column is achieved through the use of thick film printed wiring conductor patterns formed on the outside surfaces of the elongated insulating housing member 12 as shown at 41 in FIGS. 10, 11 and 12. Referring to FIG. 10, it will be seen that the printed wire conductor 41 is selectively formed on the exterior of housing 12 and terminates in snap-acting spring biased electrical connector device 42, sometime referred to as a "pogo pin" contactor. The "pogo pin" contactor 42 has a biasing spring 43 of conductive spring material which engages at one end a conductive flange 42F integrally formed with the conductive "pogo pin" contactor. At the other end a conductive pad area 41P is formed which is a conductive extension of the printed wire conductor 41. The conductive spring 43 both physically biases the end of the "pogo pin" contactor 42 into good physical contact with the metallized conductive layer 30 on the exterior of a lens element 27, 28 or 29 or a conductive pad area such as 25 formed on the deflector element 21 thereby providing good physical and electrical contact to the respective element which it engages. This occurs after insertion of the elements into their proper axial position within insulating housing 12 as the pins must be retracted to provide clearance during insertion. As best shown in FIG. 9 of the drawings, a separate "pogo pin" electric connector 42 is provided for each individual element of the electron-optical column which requires its own unique energizing or control potential. The arrangement shown in FIG. 9 corresponds to that which would be required to operate a three-plate element Einzel lens structure, such as shown in FIG. 8, wherein an apertured plate element 33 is secured to the last lens element in the structure followed by a deflector element 21.

Assemblage of Multiple Electron Beam-Optical Channels in Compact Cluster

In order to form a multi-beam electron optical lithography system utilizing a plurality of the single stage electron-optical columns described above to form a multi-channel system, the individual electron-optical columns must be held in a compact array aligned both axially and in rotational orientation with respect to each other and with respect to a target surface over which they are clustered. To achieve this end, an insulating board member shown generally at 14 in FIGS. 1 and 2, is provided. As best shown in FIG. 2, the insulating board member 14, sometimes referred to as a "mother board" has a plurality of openings formed therein, shown in detail in FIG. 11 at 140, which are circular in nature and have substantially the same inside diameter as the outside diameter of the respective elongated insulating housings 12 so as to provide an interference press fit for the respective elongated housings. The openings are also provided with a slotted keyway to accommodate a complementary fitting axially extending key shown at 12K in FIG. 11 formed on the lower end of each of the elongated housings 12. By fitting the key 12K into its appropriate keyway formed in the insulating support mother board 14, proper rotational orientation is provided for the respective elongated housings 12 and their assembled modular electron-optical column lens, deflector and aperture elements automatically during assembly.

In order to provide proper axial alignment of the assembly elongated housings 12, each housing 12 is provided with an integral flange 12F circumferentially surrounding its outer surface as shown in FIG. 11 of the drawings. The flange 12F is formed at an intermediate position along the length of the respective elongated housings 12 at a position about one-third of the length of the housing up from its electron beam output end disposed over the target surface 13 and about two-thirds down from the opposite or upper end in which an electron gun (not shown) is mounted and centered on the electron beam optical axis of the housing. Thus, when assembling all of the electron beam optical columns together in an array on the insulating support board member 14, the lower ends thereof are initially rotationally aligned by insertion of the key portion 12K into the complementary keyways formed on the insulating support member 14 as shown in FIG. 2 and then slid downwardly until the flanges 12F seat upon the circumferentially surrounding side edges of the openings 140 in the support member 14. To assure rigidity, the flanges then may be secured by a suitable insulating adhesive to the support member 14. In this manner, both axial alignment and proper rotational orientation of the electron-optical column elements is achieved in a simple, easy and low cost manner.

Supply electrical connections are made between the printed wiring patterns 41 formed on the respective electron beam optical colums 12 through a mating receptacle shown at 43 on the insulating support board member 14 and a small pogo-type snap-acting switching mechanism to a supply printed wiring conductor pattern 44 formed in the interior of the insulating support board member 14 as best shown in FIG. 11. The receptacle 43, sometime referred to as a via, provides an access opening to an exposed contact pad portion of a thick film printed conductor pattern 44 to which a spring-biased pogo contact member in the pogo connector 42 engages upon the flange 12F being seated upon and secured to the insulating support member 14. In this manner, good electrical inter-connection of the two sets of printed wiring conductors automatically is provided by the snap-action operation of the spring-biased pogo-type connector. This occurs automatically upon proper assembly of a respective electron beam optical column in its predetermined position on the insulating support board member 14 and is readily accomplished at low cost without requiring discrete individual hard wire connections by soldering or otherwise between the individual printed wiring conductors of the respective supply printed wiring patterns on insulating board member 14 and the printed wiring patterns formed on the outer surfaces of the individual electron beam optical columns 12. As noted earlier in the specification, if the channels are mounted on 40 millimeter centers in a rectilinear array as shown in FIG. 2, approximately 400 electrical connections between the channels and external electronic supply and control sources must be made and the use of discrete printed wiring connectors is impossible within the space allowed, not to mention the additional labor and cost to provide such hard wire connections.

Insulating Support Member As Vacuum Feed-Thru

As noted earlier, the novel insulating support board member 14 serves the multiple function of providing for support and alignment as well as electrical supply connections to the elements of the respective electron-optical channels 12 and also serves as a vacuum feed-thru. For this purpose, the insulating support board member 14 is fabricated using two layers 14A and 14B of commercially available, insulating ceramic board having thick film printed wiring patterns 44 formed on the mating inside surfaces of the two layers 14A and 14B. The layers 14A and 14B then are co-fired using a commercially known process so as to hermetically seal the two layers 14A and 14B together particularly at their outside edges. This results in an hermetically sealed planar board member having the conductive wiring patters 44 insulatingly sealed on its inside and smooth upper and lower planar outside surfaces. Transfer of the wiring patterns from the interior of the support board member 14 to either of its outside surfaces is achieved through the use of the vias 43 described above with relation to FIG. 11 and which are formed in the ceramic board layers 14A and 14B in advance of firing. The vias 43 allow for exterior contact to the interior printed wiring patterns by means of spring-biased pogo-type contact devices 42 as described earlier with respect to FIG. 11.

As best shown in FIGS. 12 and 2 of the drawings, the insulating support board member 14 outside circumferential edge is designed to extend to and beyond the circumferential side walls of the evacuated housing 11 within which the cluster of single beam electron-optical channels are mounted. For this reason, the housing 11 is manufactured in a two-part assembly with suitable O-ring seals shown at 46 in FIG. 12 formed in their mating circumferential ends. The hermetically sealed support board member 14 is sandwiched between the upper and lower sections of the outer vacuum housing 11 using standard O-ring seals 46 to form a vacuum-tight seal while the board member 14 also provides a planar electrical feed-thru for the printed electrical conductor connection to the various elements and components of the multiple electron-optical columns within housing 11. As best shown in FIG. 12, the internal printed wiring conductor patterns 44 terminate in multiple contact connector devices 47 of known, commercially available construction which operate in an ambient air atmosphere. Through the connector devices 47, the required operating and control potentials are supplied to the various elements and components of the respective electron-optical column comprising the multi-channel assembly.

INDUSTRIAL APPLICABILITY

From the foregoing description it will be appreciated that the invention provides a novel modular electron-optical column and method of construction employing standardized modular components which are simple, readily assembled and low cost. The invention further provides a multi-channel assembly of such electron-optical columns operated together in a multi-beam cluster over a common small target area within a common evacuated outer housing. The multi-channel assembly employs a novel insulating support member for mounting the cluster of electron-optical columns within the evacuated housing and supplying the respective electron-optical columns with required operating and control electric potentials. The insulating support member has printed circuit wiring patterns formed thereon for the supply of the electric operating and control potentials through the vacuum-tight walls of the outer evacuated housing and employs a new type of laminated, hermetically-sealed ceramic structure having internally formed printed wiring conductor patterns providing feed-thru electrical connection from the exterior to the interior of the vacuum-tight housing. The assembly thus fabricated provides an electron beam lithography system for direct electron beam writing on small diameter semiconductor target wafers upon which a multiplicity of integrated micro-circuit patterns are to be written simultaneously by the parallel operated array of multibeam electron-optical system.

While the specific embodiment of the invention described is designed for use with electron beams, it is believed obvious to those skilled in the art that the modular component and assembly structure and techniques of fabrication readily can be employed for the construction of other charged particle beam forming and manipulation systems such as ion beam optical columns and arrays.

Having described one embodiment of a novel modular all-electrostatic charged particle beam optical column and assembly of said columns into an array and method of manufacture thereof constructed in accordance with the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A miniaturized, easily assembled and aligned, all-electrostatic charged particle optical column comprising an outer hollow, elongated insulating housing for supporting at least a unitary deflector for deflecting the charged particle beam along two orthogonal axes simultaneously, lens and aperture elements together with required insulating spacer elements of a charged particle column axially centered on the optical axis of the charged particle optical column and properly axially-spaced and rotationally oriented relative to each other and to a target plane, said deflector, lens, aperture and spacer elements all being fabricated in unitary structure form with equal outside dimensions for sliding into the elongated housing within its center opening with an interference press fit while being centered on the center optical axis of the assembly and being axially spaced-apart predesigned distances by interspersed different thickness spacer elements, said elongated housing and at least the unitary structure deflector and lens elements having complementary axially extending keys and keyway formed thereon for maintaining at least the deflector, lens and aperture elements in a desired rotational orientation, said aperture elements being formed by an apertured flat plate secured to one end of a lens element, said deflector, lens, spacer and aperture elements having suitable size internal openings formed therein centered on the charged particle optical axis of the elongated housing.

2. A charged particle optical column according to claim 1 wherein the elongated insulating housing member has printing wiring conductive pathways and terminal pads forming on the exterior surface thereof and cooperating with respective spring-biased plunger-type electrical contacts for making electrical contact through the wall of the housing with respective printed wiring contact surfaces formed on the outside surface of the respective deflector, lens and aperture elements.

3. A charged particle optical column according to claim 2 wherein the elongated insulating housing is circular in cross-section with an axially extending rib-like key formed along the internal opening thereof and the unitary structure deflector, lens and spacer elements are annular-shaped with a complementary axially extending keyway formed along their outside surface.

4. A charged particle optical column according to claim 3 wherein the unitary structure lens elements each comprise a relatively flat annular-shaped integral body formed of metal or metallized ceramic and having a center internal opening therethrough for accommodating the charged particle beam path and which also is continuously metallized along with the external surfaces of the body whereby the metallized external surface forms an electrical contact surface for the supply of electric potential to the lens element.

5. A charged particle optical column according to claim 4 wherein the unitary structure aperture elements are formed by securing a metal or metallized ceramic plate to one end of a lens element by electrically conductive connection means with apertured plate having a suitably formed aperture therein to accommodate the charged particle beam path with the side edges of the plate defining the aperture being electrically conductive and at the same electric potential as the lens element to which it is attached.

6. A charged particle optical column according to claim 2 wherein the unitary structure deflector elements each comprise a relatively flat annularly-shaped, integral ceramic body having a central axial opening therethrough for passage of a charged particle beam and having selectively metallized surfaces thereon which define a plurality of different deflector electrode segments for producing a desired deflection field acting on the charged particle beam to cause it to conform to a desired beam path, said selectively metallized surfaces being formed by a plurality of axially extending slots cut into the annular ceramic body around the inner periphery of the central opening therein and defining a desired number of deflector electrode segments with the bottom of each slot being non-metallized, respective, non-metallized insulating boundary lines separating adjacent deflector electrode segments integrally formed from the ends of each slot continuously extended around each desired deflector segment of the annular body, and the remaining surfaces of the annular body being metallized such that the portion of the metallized surface of each segment within the central opening between the slots forms a deflector electrode and the portion of the metallized surface of the segment on the exterior circumference of the annular body serves as an electrical contact surface for supplying operating electric potential to the respective deflector electrode segment.

7. A charged particle optical column according to claim 5 wherein the unitary structure deflector elements each comprise a relatively flat annularly-shaped, integral ceramic body having a central axial opening therethrough for passage of a charged particle beam and having selectively metallized surfaces thereon which define a plurality of different deflector electrode segments for producing a desired deflection field acting on the charged particle beam to cause it to conform to a desired beam path, said selectively metallized surfaces being formed by a plurality of axially extending slots cut into the annular ceramic body around the inner periphery of the central opening therein and defining a desired number of deflector electrode segments with the bottom of each slot being non-metallized, respective, non-metallized insulating boundary lines separating adjacent deflector electrode segments integrally formed from the ends of each slot continuously extended around each desired deflector segment of the annular body, and the remaining surfaces of the annular body being metallized such that the portion of the metallized surface of each segment within the central opening between slots forms a deflector electrode and the portion of the metallized surface of the segment on the exterior circumference of the annular body serves as an electrical contact surface for supplying operating electric potential to the respective deflector electrode segment.

8. A multi-channel assembly of single deflector stage, miniaturized easily assembled and aligned all-electrostatic charged particle beam optical columns mounted in a compact array wherein each all-electrostatic charged particle optical column comprises an outer hollow, elongated insulating housing for supporting at least the deflector, lens and aperture elements together with required insulating spacer elements of a charged particle column axially centered on the optical axis of the charged particle optical column and properly axially-spaced and rotationally oriented relative to each other and to a target plane, said deflector, lens, aperture and spacer elements all being fabricated in unitary structure form with equal outside dimensions for sliding into the elongated housing within its center opening with an interference press fit while being centered on the center optical axis of the assembly and being axially spaced-apart predesigned distances by interspersed different thickness spacer elements, said elongated housing and at least the unitary structure deflector and lens elements having complementary axially extending keys and keyway formed thereon for maintaining at least the deflector, lens and aperture elements in a desired rotational orientation, said aperture elements being formed by an apertured flat plate secured to one end of a lens element, said deflector, lens, spacer and aperture elements having suitable size internal openings formed therein centered on the charged particle optical size of the elongated housing, and the elongated insulating housing member has printed wiring conductive pathways and terminal pads formed on the exterior surface thereof and cooperating with respective spring-biased plunger-type electrical contacts for making electrical contact through the wall of the housing with respective printed wiring contact surfaces formed on the outside surface of the respective deflector, lens and aperture elements, and wherein there are a plurality of identical individual charged particle beam optical columns supported in a compact cluster on a common insulating support member having preformed holes therethrough of equal dimension to the outside dimensions of the elongated insulating housings for securely holding the columns in a preset array aligned rotationally and positioned with their electron beam optical axes orthogonal to the support member and parallel with respect to each other, there being a predesigned opening provided for each respective optical column together with predesigned alignment key and keyway means and sets of printed wiring conductors formed on the common support member for supplying operating voltages and control signals to the respective charged particle optical columns supported within the respective openings and snap-acting electrical connector means for selectively connecting discrete printed wiring conductors formed on the outer surface of the elongated insulating housing of each charged particle optical column to respective complementary supply printed wiring conductors formed on the common insulating support member.

9. A multi-channel assembly of single deflector stage, miniaturized, all-electrostatic charged particle beam optical columns mounted in a compact array wherein each all-electrostatic charged partical optical column comprises an outer hollow, elongated insulating housing for supporting at least the deflector, lens and aperture elements together with required insulating spacer elements of a charged particle column axially centered on the optical axis of the charged particle optical column and properly axially-spaced and rotationally oriented relative to each other and to a target plane, said deflector, lens, aperture and spacer elements all being fabricated in unitary structure form with equal outside dimensions for sliding into the elongated housing within its center opening with an interference press fit while being centered on the center optical axis of the assembly and being axially spaced-apart predesigned distances by interspersed different thickness spacer elements, said elongated housing and at least the unitary structure deflector and lens elements having complementary axially extending keys and keyway formed thereon for maintaining at least the deflector, lens and aperture elements in a desired rotational orientation, said aperture elements being formed by an apertured flat plate secured to one end of a lens element, said deflector, lens, spacer and aperture elements having suitable size internal openings formed therein centered on the charged particle optical axis of the elongated housing, the elongated insulating housing member has printed wiring conductive pathways and terminal pads formed on the exterior surface thereof cooperating with respective spring-biased plunger-type electrical contacts for making electrical contact through the wall of the housing with respective printed wiring contact surfaces formed on the outside surface of the respective deflector, lens and aperture elements, and the housing is circular in cross-section with an axially extending rib-like key formed along the internal opening thereof and the unitary structure deflector, lens and spacer elements are annular-shaped with a complementary axially extending keyway formed along their outside surface, the unitary structure lens elements each comprise a relatively flat annular-shaped integral body formed of metal or metallized ceramic and having a center internal opening therethrough for accommodating the charged particle beam path and which also is continuously metallized along with the external surfaces of the body whereby the metallized external surface forms an electrical contact surface for the supply of electric potential to the lens element, the unitary structure aperture elements are formed by securing a metal or metallized ceramic plate to one end of a lens element by electrically conductive connection means with apertured plate having a suitably formed aperture therein to accommodate the charged particle beam path with the side edges of the plate defining the aperture being electrically conductive and at the same electrical potential as the lens element to which it is attached, and wherein the unitary stucture deflector elements each comprise a relatively flat annularly-shaped, integral ceramic body having a central axial opening therethrough for passage of a charged particle beam and having selectively metallized surfaces thereon which define a plurality of different deflector electrode segments for producing a desired deflection field acting on the charged particle beam to cause it to conform to a desired beam path, said selectively metallized surfaces being formed by a plurality of axially extending slots cut into the annular ceramic body around the inner periphery of the central opening therein and defining a desired number of deflector electrode segments with the bottom of each slot being non-metallized, respective, non-metallized insulating boundary lines separating adjacent deflector electrode segments integrally formed from the ends of each slot continuously extended around each desired deflector segment of the annular body, and the remaining surfaces of the annular body being metallized such that the portion of the metallized surface of each segment within the central opening between the slots forms a deflector electrode and the portion of the metallized surface of the segment on the exterior circumference of the annular body serves as an electrical contact surface for supplying operating electric potential to the respective deflector electrode segment, and wherein there are a plurality of identical individual charged particle beam optical columns supported in a compact cluster on a common insulating support member having preformed holes therethrough of equal dimension to the outside dimensions of the elongated insulating housings for securely holding the columns in a preset array aligned rotationally and positioned with their charged particle beam optical axes orthogonal to the support member and parallel with respect to each other, there being a predesigned opening provided for each respective optical column together with predesigned alignment key and keyway means and sets of printed wiring conductors formed on the common support member for supplying operating voltages and control signals to the respective charged particle optical columns supported within the respective openings and snap-acting electrical connector means for selectively connecting discrete printed wiring conductors formed on the outer surface of the elongated insulating housing of each charged particle optical column to respective complementary supply printed wiring conductors formed on the common insulating support member.

10. A multi-channel assembly of single deflector stage, charged particle beam optical columns according to claim 8 wherein the common insulating support member is formed from two ceramic layers having the supply printed wiring conductor patterns formed on the mating inside surfaces and co-fired to form an integral hermetically sealed package and provided with thru layer vias formed on the ceramic layers before firing to transfer conductor connections from either outside surface to the interior and vice versa.

11. A multi-channel assembly of single deflector stage, charged particle beam optical columns according to claim 9 wherein the common insulating support member is formed from two ceramic layers having the supply printed wiring conductor patterns formed on the mating inside surfacs and co-fired to form an integral hermetically sealed package and providing with thru layer conductive vias formed on the ceramic layers before firing to transfer wiring from either outside surface to the interior and vice versa.

12. A multi-channel assembly of single deflector stage, charged particle beam optical columns according to claim 8 wherein the compact cluster of charged particle beam optical columns is mounted within a common outer evacuated housing for evacuating the separate electron beam optical columns in the cluster, the cluster being supported by said common insulating support member in electron beam writing position clustered over a common semiconductor wafer target movably supported on a movable target support within the evacuated common outer housing, the outer edges of the common insulating support member extending to the outside of the common outer housing by means of separable portions of the outer housing clamped to the common support member in a vacuum-tight manner through the medium of suitable "O" ring seals.

13. A multi-channel assembly of single deflector stage, charged particle beam optical columns according to claim 11 wherein the compact cluster of charged particle beam optical columns is mounted within a common outer evacuated housing for evacuating the separate charged particle beam optical columns in the cluster, the cluster being supported by said common insulating support member in charged particle beam writing position clustered over a common semiconductor wafer target movably supported on a movable target support within the evacuatd common outer housing, the outer edges of the common insulating support member extending to the outside of the common outer housing by means of separable portions of the outer housing clamped to the common support member in a vacuum tight manner through the medium of suitable "O" ring seals.

14. A compact easily assembled and aligned, low cost, single deflector stage, all-electrostatic charged particle beam optical column, said charged particle beam optical column being fabricated from standardized, low cost, modular elements readily assembled and aligned at low cost and being comprised by an outer hollow, elongated, insulating housing and a plurality of modular, unitary structure lens, deflector, and aperture elements together with interspersed insulating spacer elements each of unitary annular block construction with outside dimensions designed to provide an interference slide press fit within the inside diameter of the hollow elongated insulating housing, the elongated housing having printed wiring conductive pathways formed on the outer surface thereof and discrete spring biased thru electrical connection contact means mounted on the housing at different points along the axial length of the housing for ready electrical connection to exposed conductive contact surfaces on the respective modular lens, deflector and aperture elements that are axially supported within the housing for providing operating and control potential thereto.

15. A charged particle beam optical column according to claim 14 further including intracting key and keying means formed on the elongated housing and the respective modular elements to provide desired rotational orientation of the respective elements upon being inserted into the housing.

16. A multi-channel assembly of single deflector stage, compact, easily assembled and aligned, low cost, miniaturized, all-electrostatic charged particle beam optical columns mounted in a compact array wherein there are a plurality of identical individual charged particle beam optical columns supported in a compact cluster on a common insulating support member and each charged particle beam optical column is fabricated from standardized, low cost, modular elements readily assembled and aligned at low cost and being comprised by an outer hollow, elongated, insulating housing and a plurality of modular, unitary structure lens, deflector, and aperture elements together with interspersed insulating spacer elements each of unitary annular block construction with outside dimensions designed to provide an interference slide press fit within the inside diameter of the hollow elongated insulating housing, the elongated housing having printed wiring conductive pathways formed on the outer surface thereof and discrete spring biased thru electrical connection contact means mounted on the housing at different points along the axial length of the housing for ready electrical connection to exposed conductive contact surfaces on the respective modular lens, deflector and aperture elements that are axially supported within the housing for providing operating and control potential thereto, and further including intracting key and keyway means formed on the elongated housing and the respective modular elements to provide desired rotational orientation of the respective elements upon being inserted into the housing, said support member having preformed openings therethrough of equal dimension to the outside dimensions of the elongated insulating housings for securely holding the columns in a preset array aligned rotationally and positioned with their charged particle beam optical axes orthogonal to the support member and parallel with respect to each other, there being a predesigned opening provided for each respective optical column together with predesigned alignment key and keyway means and sets of printed wiring conductors formed on the common support member for supplying operating voltages and control signals to the respective charged particle optical columns supported within the respective openings and snap-acting electrical connector means for selectively connecting discrete printed wiring conductors formed on the outer surface of the elongated insulating housing of each charged particle optical column to respective complementary supply printed wiring conductors formed on the common insulating support member.

17. An improved deflector for a charged particle beam optical column comprising a relativey flat annularly-shaped, integral ceramic body having a central axial opening therethrough for passage of a charged particle beam and having selectively metallized surfaces thereon which define a plurality of different deflector electrode segments for producing a desired deflection field acting on the charged particle beam to cause it to conform to a desired beam path, said selectively metallized surfaces being formed by a plurality of axially extending slots cut into the annular ceramic body around the inner periphery of the central opening therein and defining a desired number of deflector electrode segments with the bottom of each slot being non-metallized, respective, non-metallized insulating boundary lines separating adjacent deflector electrode areas integrally formed from the ends of each slot continuously extended around each desired deflector segment of the annular body, and the remaining surfaces of the annular body being metallized such that the portion of the metallized surface of each segment within the central opening between the slots forms a deflector electrode and the portion of the metallized surface of the segment on the exterior circumference of the annular body serves as an electrical contact surface for supplying operating electric potential to the respective deflector electrode segment.

18. The method of fabricating a modular, low cost, unitary annular deflector element for an electrostatic charged particle optical column from an annular block of ceramic; said method comprising cutting a number of axially extending kerfs equal to the number of desired deflector electrodes into the surface of the inner opening of the block of ceramic, masking with a relatively thin flat masking wire the bottom of each kerf and extending the masking wire around at least a significant portion of the cross-sectional circumference of the annular body so as to isolate areas between kerfs for metallization, metallizing the areas between the kerfs to form the desired number of deflector electrodes, and extending the metallization at least partially around the cross-sectional circumference of the annular body between the kerfs to cover annular segments of the annular side surfaces of the ceramic block each of which extend to and conductively contact respective deflector electrode areas to thereby form repective electrical contact pad areas for the respective deflector electrodes.

19. The method of manufacturing a compact easily assembled and aligned, low cost, single deflector stage, all-electrostatic charged particle beam optical column from a plurality of standardized components, said charged particle beam optical column being fabricated from standardized, low cost, modular elements readily assembled and aligned at low cost and being comprised by an outer hollow, elongated, insulating housing and a plurality of modular, unitary-structure lens, deflector and aperture elements together with interspersed insulating spacer elements each of unitary annular block construction with outside dimensions designed to provide an interference slide press fit within the inside diameter of the hollow elongated insulating housing, the elongated housing having printed wiring conductive pathways formed on the outer surface thereof and discrete spring-biased thru electrical connection contact means mounted on the housing at different points along the axial length of the housing for ready electrical connection to exposed conductive contact surfaces on the respective modular lens, deflector and aperture elements that are axially supported within the housing for providing operating and control electric potentials thereto; said method comprising providing interacting key and keyway means on the elongated housing and the respective modular elements to provide desired rotational orientation of the respective modular elements upon being inserted into the housing, inserting the modular elements one at a time into the housing in an order determined by the design of a particular electron-optical column, interspersing between particular modular elements an insulating spacer element pursuant to the design of an electron optical column to be assembled, locking the assembled modular elements and inter-'spersed spacer elements into predesigned axial position after insertion of all of the elements required in the design of the optical column within the housing, and activating the discrete spring-biased thru electrical connections to close on the contact surfaces of the assembled modular elements to complete the assembly.

20. The method of fabricating a multi-channel assembly of single deflector stage, miniaturized, all-electrostatic charged particle optical columns mounted in a compact array wherein there are a plurality of identical individual charged particle beam optical columns each comprising a compact, easily assembled and aligned, low cost, single deflector stage, all-electrostatic charged particle beam optical column assembled from a plurality of standardized components, said charged particle beam optical column being fabricated from standardized, low cost, modular elements readily assembled and aligned at low cost and being comprised by an outer hollow, elongated, insulating housing and a plurality of modular unitary-structure lens, unitary deflector and aperture elements' together with interspersed insulating spacer elements each of unitary annular block construction with outside dimensions designed to provide an interference slide press fit within the inside diameter of the hollow elongated insulating housing, the elongated housing having printed wiring conductive pathways formed on the outer surface thereof and discrete spring-biased thru electrical connection contact means mounted on the housing at different points along the axial length of the housing for ready electrical connection to exposed conductive contact surfaces on the respective modular lens, deflector and aperture elements that are axially supported within the housing for providing operating and control electric potentials thereto; said method comprising providing interacting key and keyway means on the elongated housing and the respective modular elements to provide desired rotational orientation of the respective modular elements upon being inserted into the housing, inserting the modular elements one at a time into the housing in an order determined by the design of a particular electron-optical column, interspersing between particular modular elements an insulating spacer element pursuant to the design of an electron optical column to be assembled, locking the assembled modular elements and interspersed spacer elements into predesigned axial position after insertion of all of the elements required in the design of the optical column within the housing, and activating the discrete spring-biased thru electrical connections to close on the contact surfaces of the assembled modular elements to complete the column, all the charged particle optical columns being supported in a compact cluster on a common insulating support member relative to a common target surface; said method further comprising: performing a plurality of holes through the support member of substantially equal dimensions to the outside dimensions of the elongated insulating housings to provide a slide interference fit for securely holding the columns in a preset array; providing a predesigned complementary key and keyways means for each opening within the common support member and on each respective optical column for maintaining the optical columns aligned rotationally and positioned with their charged particle beam optical axes orthogonal to the support member and parallel with respect to each other; providing predesigned sets of printed wiring conductors formed on the common support member for supply operating voltages and control signals to the respective charged particle optical columns supported within the respective openings, providing snap-action electric connector means for selectively connecting discrete printed wiring conductors formed on the outer surface of the elongated insulating housing of each charged particle optical column to respective complementary supply printed wiring conductors formed on the common insulating support member; providing a mounting flange for each optical column; mounting the plurality of electron-optical columns on the support member by aligning the key and keyway means of each column in its opening and inserting the column into the opening until the mounting flange engages the peripherally supporting edges of the support member with the printed wiring conductors on each column outer surface aligned with complementary aligned supply printed wiring conductors on the support member, securing the mounting flange of each column to the support member and activating the snap-acting electric connector means of each column to provide electrical interconnections between the printed wiring conductors on the columns and the supply printed wiring conductors on the support member.

21. The method of fabricating a multi-channel assembly of single deflector stage, miniaturized, all-electrostatic charged particle optical columns mounted in a compact array according to claim 20 and clustered over a common target surface within a vacuum environment; said method comprising: providing a two-part evacuated outer housing of greater outside dimensions than the compact array of charged particle optical columns and lesser outside dimensions than the common support member; mounting the common support member over a lower portion of the two-part evacuated outer housing with the multiple charged particle optical columns clustered over a common target surface at the opposite end thereof from that on which the support member is mounted and with the supply printed wiring patterns extending out to the outer edge portions of the support member beyond the outer dimension of the outer housing; supporting the remaining portion of the outer housing on the support member in alignment with the lower portion; providing sealing means between the respective surfaces of the support member and the upper and lower edges of the housing portions engaging the support member; evacuating the outer housing, and providing openings through the support member portion within the outer housing to allow for out-gassing of both the upper and lower housing portions from a single source of evacuation.

22. An assembly of electronic components mounted within an outer evacuated housing for maintaining the components within a vacuum environment, the components being supported by an insulating support member within the evacuated outer housing with the outer edges of the insulating support member extending outside of the housing, the evacuated outer housing being comprised by separable portions clamped to opposite sides of the insulating support member in a vacuum-tight manner through the medium of suitable vacuum sealing means, and the insulating support member being formed from a plurality of ceramic layers having supply printed wiring conductor patterns formed on the mating inside surfaces thereof and co-fired to form an integral hermetically sealed package and being provided with thru-layer conductive vias formed on the ceramic layers before firing to transfer conductive connections from either outside surface to the interior of the package and vice versa for the supply of operating and control electric potentials to the electronic components mounted within the evacuated housing.

* * * * *